United States Patent [19]
Osada et al.

[11] Patent Number: 5,569,350
[45] Date of Patent: Oct. 29, 1996

[54] MECHANISM AND METHOD FOR MECHANICALLY REMOVING A SUBSTRATE

[75] Inventors: Tomoaki Osada; Yasuyuki Shirai, both of Tokyo, Japan

[73] Assignee: Anelva Corporation, Tokyo, Japan

[21] Appl. No.: 389,789

[22] Filed: Feb. 16, 1995

[30] Foreign Application Priority Data

Mar. 18, 1994 [JP] Japan .................................. 6-048703

[51] Int. Cl.⁶ .............................. C23F 1/02; C23C 16/00
[52] U.S. Cl. ...................... 156/345; 118/723 E; 118/728; 118/729; 118/500; 204/298.15
[58] Field of Search .......................... 118/723 E, 723 R, 118/728, 729, 500; 156/345; 204/298.15; 187/267, 268

[56] References Cited

U.S. PATENT DOCUMENTS

| | | | |
|---|---|---|---|
| 3,983,401 | 9/1976 | Livesay | 250/492 A |
| 4,439,261 | 3/1984 | Pavone | 156/345 |
| 4,838,978 | 6/1989 | Sekine | 156/345 |
| 4,990,229 | 2/1991 | Campbell et al. | 204/298.06 |
| 5,000,113 | 3/1991 | Wang | 118/723 |
| 5,122,251 | 6/1992 | Campbell et al. | 204/298.06 |
| 5,215,619 | 6/1993 | Cheng | 165/345 |
| 5,228,052 | 6/1993 | Kikuchi | 373/18 |
| 5,332,443 | 7/1994 | Chew | 118/729 |
| 5,366,002 | 11/1994 | Tepman | 165/1 |
| 5,372,648 | 12/1994 | Yamamoto | 118/723 E |
| 5,421,893 | 6/1995 | Perlov | 118/725 |
| 5,421,894 | 6/1995 | Lei | 118/725 |
| 5,460,684 | 10/1995 | Saeki | 156/345 |
| 5,462,603 | 10/1995 | Murakami | 118/719 |
| 5,501,739 | 3/1996 | Yamada | 118/719 |

*Primary Examiner*—Robert Kunemund
*Assistant Examiner*—Jeffrie R. Lund
*Attorney, Agent, or Firm*—Burns, Doane, Swecker & Mathis, LLP

[57] ABSTRACT

A mechanism for completely separating a substrate, such as a semiconductor substrate, from at base in such a way that the substrate is in a horizontal position and can be easily removed from an electrostatic chuck. The substrate is mounted on a pedestal which is placed on a base such as an electrode. Pins are mounted within the base beneath a central portion of the substrate. The pins can be moved vertically through the circular pedestal to lift the substrate from the pedestal. A ring is mounted around the pedestal and underneath the outer edge of the substrate. When the pins are protrude beyond the top surface of the circular pedestal the substrate is lifted and caused to tilt. The ring then is lifted to act on the outer edge of the rear surface of the substrate, thus separating the substrate from the circular pedestal and returning the substrate to a horizontal position.

20 Claims, 14 Drawing Sheets

MECHANISM AND METHOD FOR MECHANICALLY REMOVING A SUBSTRATE

BACKGROUND OF THE INVENTION

1. Field of the Invention

The present invention relates to a mechanism and a method for mechanically removing a substrate clamped to a base and, more particularly, to a mechanism and a method for mechanically removing a substrate which is clamped to an electrode in a plasma processing apparatus through a residual static charge.

2. Description of the Related Art

Figure 8:
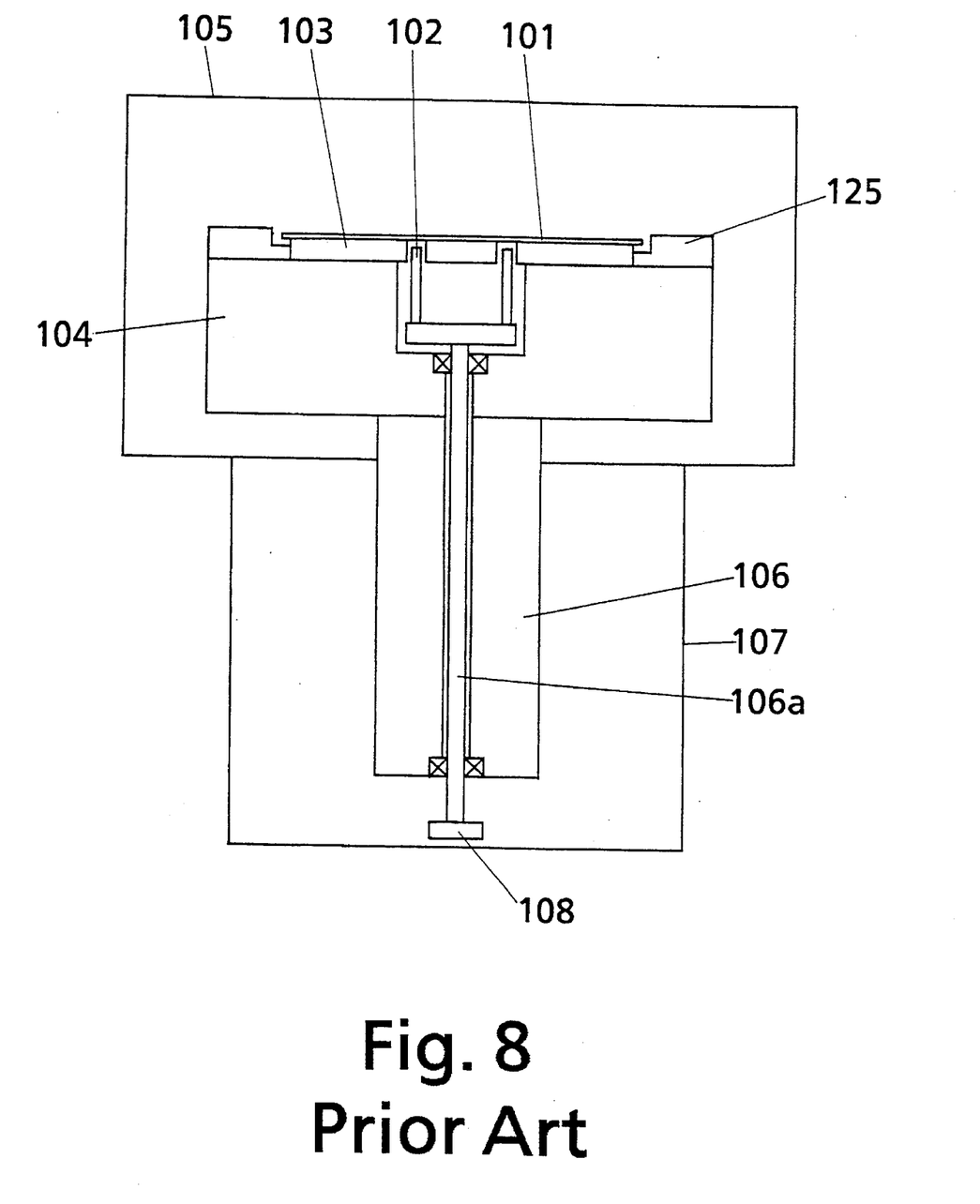
FIG. 8 is a side schematic view of the prior art mechanical removal mechanism.

A well-known electrostatic clamp for holding a substrate, such as a semiconductor substrate to an electrode in a plasma processing apparatus is shown in FIG. 8. The plasma processing apparatus of FIG. 8 is used, for example, for dry-etching of semiconductor substrates. A disk-shaped substrate 101 is placed within the plasma processing apparatus on a pedestal 103. The pedestal 103 is positioned on an electrode 104. Substrate-elevating pins 102 are disposed within the electrode 104 and below the substrate. The pins 102 are lifted so that they extend through openings in the pedestal to elevate the substrate 101. The plasma processing apparatus of FIG. 8 also includes a processing chamber 105 surrounding the electrode 104, a prop 106 for vertically moving the electrode 104, and a frame 107. A disc-shaped cover 125 is mounted on the top surface of the electrode 104 surrounding the pedestal 103.

The substrate 101 is clamped to the electrode 104 by an electrostatic clamping force which is created by a static charge accumulated on the dielectric material. In order to remove the substrate 101 from the pedestal 103, the electrode 104 is lowered together with the prop 106 along a shaft 106a. As the electrode is lowered, a stopper 108 which is mounted at the lower end of the shaft 106a, engages the lower wall of the frame 107. When the electrode 104 is moved further downward, the pins 102 protrude beyond the top surface of the pedestal 103. The substrate 101 is thereby separated from the pedestal 103 by the pins 102.

Figure 9:
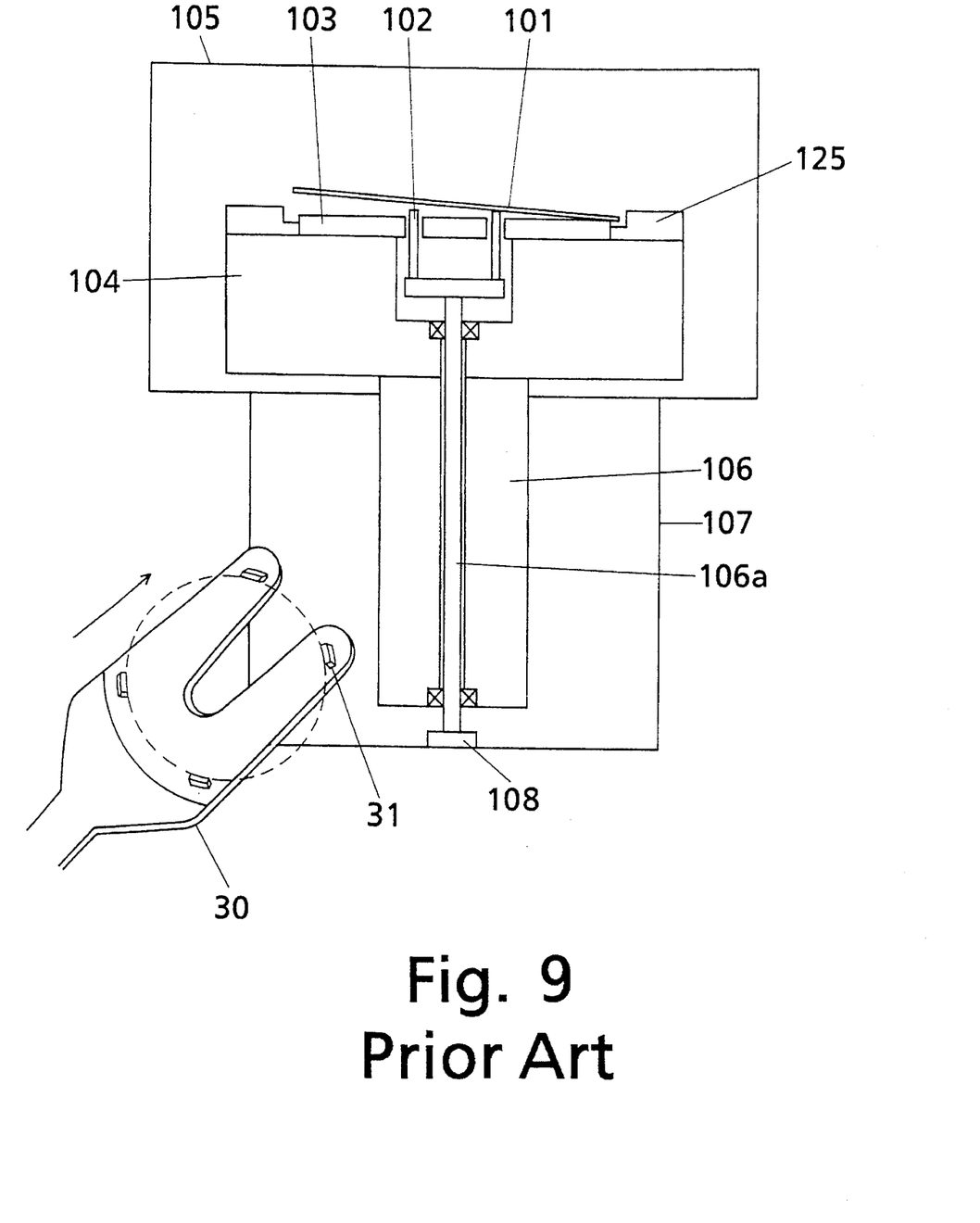
FIG. 9 is a side schematic view of the prior art mechanism of FIG. 8, in which the pins are raised.

In the mechanism for removing the substrate shown in FIG. 8, the substrate 101 is slightly raised by the pins 102, when those portions of the substrate 101 which are lifted by the pins 102 are slightly separated from the pedestal 103. However, those portions of the substrate 101 which are not lifted by the pins 102, especially the edges of the substrate, still adhere to the pedestal 103 because of a residual static charge remaining on the pedestal 103. If the substrate 101 is raised further by the pins 102, a part of the edge of the substrate 101 remains adhered to the pedestal 103, as shown in FIG. 9 causing the substrate to tilt. When the pins 102 stop moving upward so that the substrate 101 may be removed from the processing chamber 105, then the substrate 101 remains in a tilted position. In this tilted posture, when a hand 30 of a transferring robot is inserted between the substrate 101 and the pedestal 103 to remove the substrate, the substrate is not accommodated within the proper region on the hand 30 between the four claws 31 and indicated by the broken line. This problem hinders the transfer of the substrate from the processing chamber. However, if the substrate 101 was maintained in a horizontal posture during the removal of the substrate from the processing chamber, then the problem associated with the prior art would be eliminated.

OBJECTS AND SUMMARY

It is an object of the present invention to provide a mechanism for completely disengaging a substrate from a pedestal in such a way that the posture of the substrate remains horizontal.

A mechanism for mechanically removing a substrate according to the present invention includes a base and a pedestal placed on said base to hold said substrate. The pedestal is smaller than the substrate so that the edges of the substrate hang over the edge of the pedestal. Substrate elevating members are provided which are capable of protruding beyond said pedestal to lift the substrate. A vertically movable ring is disposed around the pedestal, having a portion disposed below the edge of the substrate. The portion of the ring disposed below the edge of the substrate is defined by having an upper surface which is below the planar upper surface of said pedestal. A driving means is provided for lifting the edge of the substrate after the pins lift said substrate.

A mechanism for mechanically removing a substrate according to another aspect of the invention includes a base and a pedestal placed on said base to hold said substrate. The pedestal is smaller than the substrate so that the edge of the substrate extends past the edge of the pedestal. The mechanism includes substrate elevating members capable of protruding beyond the pedestal and a vertically movable ring disposed around said pedestal. The ring has a portion disposed below an edge of the substrate having an upper surface which is below the plane defined by the upper surface of said pedestal. A first driving means is provided for lifting the substrate elevating members and a second driving means is provide for lifting said ring.

The present invention also relates to a method of mechanically removing a substrate held on a pedestal including the steps of, lifting a central portion of said substrate upward by means of substrate elevating members, and lifting an edge of said substrate by means of a ring while raising said substrate by means of said substrate elevating members to remove said substrate from said pedestal.

BRIEF DESCRIPTION OF THE DRAWINGS

The invention will be described in greater detail with reference to the accompanying drawings in which like elements bear like reference numerals, and wherein.

DETAILED DESCRIPTION

Figure 1:
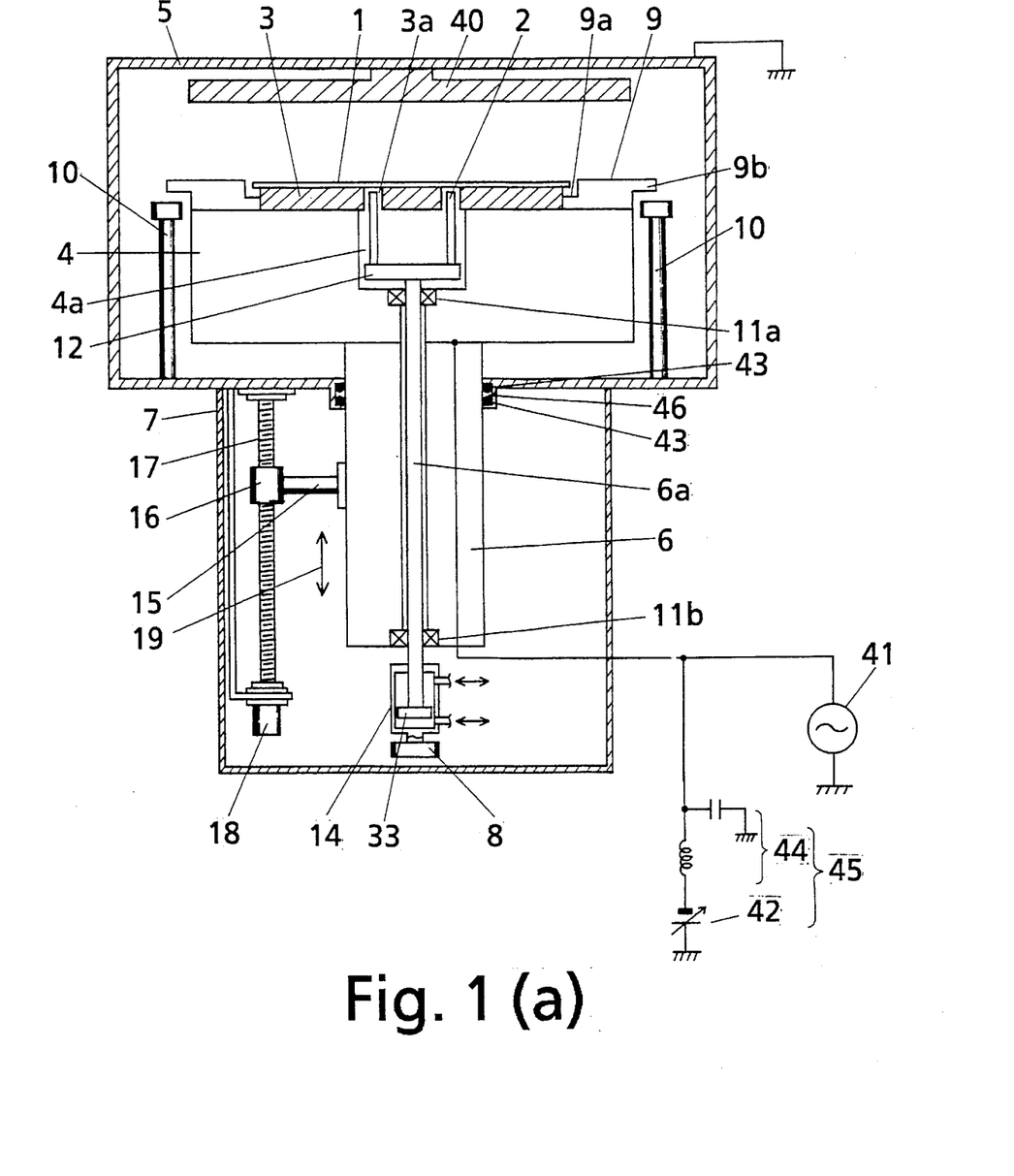
FIG. 1(a) is a side view partly in section view of a mechanical removal mechanism according to a first embodiment of the invention.
FIG. 1(b) is a top view of the mechanical removal mechanism shown in FIG. 1(a)

FIG. 1(a) is a side view of a mechanism for mechanically removing a substrate affixed to an electrode by an electrostatic force according to the present invention. The mechanical removal mechanism is shown in FIG. 1(a) in a parallel-plate etching processing chamber 5 of a multi-chamber dry-etching system, such as, "ANELVA-4100" manufactured by Anelva Corporation. However, the mechanical removal mechanism of the present invention may be used advantageously in other processing chambers.

The chamber 5 of the present invention has a pipe (not shown) for introducing an etching gas into the chamber and a vacuum pump (not shown) for evacuating the inside of the chamber. In addition, the chamber 5 is equipped with electrodes 4 and 40 which are placed opposite to each other. A semiconductor substrate 1 is placed over the electrode 4 on a dielectric circular pedestal 3 which is placed on the electrode 4. The pedestal is either made of a dielectric material or is made of metal coated with a thin dielectric film. Where a dielectric film, such as a $SiO_2$ film, is formed on the bottom side of the substrate 1, the substrate can be clamped to the electrode 4 even if the pedestal is made of a metal.

The circular pedestal 3 is smaller than the substrate 1 so that the edge of the substrate 1 hangs over the edge of the pedestal 3 on all sides. A ring 9 is mounted around the pedestal 3 and provided with an inner annular recessed portion 9a. A part of the annular recessed portion 9a is positioned below the bottom surface of the edge of the substrate 1 which hangs over the circular pedestal 3. The ring 9 is provided with an annular brim 9b on its outer surface.

As shown in FIG. 1(b), the bottom surface of the annular brim 9b is disposed above a portion of the heads of four stoppers 10 that are mounted outside the electrode 4. These stoppers 10 are spaced circumferentially and at regular intervals from each other around the electrode 4.

An rf power supply 41 for generating a plasma and an electrostatic clamp power source system 45 are connected to the electrode 4. The electrostatic clamp power source system 45 is composed of a variable dc power source 42 and a filter 44 for filtering out rf components of an alternating current.

The circular pedestal 3 is provided with four holes 3a which are spaced circumferentially at equal intervals from each other. Pins 2 are positioned to extend from the electrode 4 through these holes 3a for removing the substrate and to withdraw into the holes during etch processing of the film. At least three pins are needed in order to lift the substrate 1 from the pedestal 3. The four pins 2 shown in the embodiment of FIG. 1(b) stand on a circular supporting plate 12 and are aligned with the holes 3a, respectively. A shaft 6a is attached to the bottom of the supporting plate 12 and held by bearings 11a and 11b so as to be slidable vertically within a prop 6. The lower end of the shaft 6a is connected to a piston 33 inside a piston cylinder 14. The shaft 6a can be moved vertically independent of the vertical movement of the prop 6 by forcing pressurized fluid, such as oil or air, into and out of the cylinder 14. A stopper 8 is mounted on the lower end of the cylinder 14. When the stopper 8 hits the lower portion of the frame 7, the shaft 6a can no longer move downward.

The aforementioned prop 6 is mounted on the bottom of the electrode 4 and protrudes out of the chamber 5. Two O-rings 43 are inserted in a groove 46 in the wall of the chamber 5 to maintain the inside of the chamber 5 hermetically airtight. Grease is preferable provided in the groove 46, around the O-rings 43, to maintain the airtight seal and to permit the prop 6 to slide freely.

An arm 15 is attached at one end to one side wall of the prop 6 and at the other end to a nut 16. The nut 16 is threaded on a screw 17 mounted inside the frame 7. The prop 6 is moved vertically as indicated by the arrow 19 by rotating the screw 17 through the use of an electric motor 18. The movement of the prop 6 causes the electrode 4 to move vertically in the same direction as the prop 6.

In operation, the substrate 1 is clamped to the circular pedestal 3 by the electrostatic force and the pins 2 remain in the central recess 4a in the electrode 4 to prevent the upper ends of the pins 2 from protruding beyond the upper surface of the circular pedestal 3 during film etch processing. During film etch processing the stopper 8 does not abut the lower surface of the frame 7 and the piston 33 is at a lowered position in the cylinder 14. Also, the lower surface of the annular brim 9b of the ring 9 does not engage the stoppers 10.

When the substrate 1 is to be removed, the prop 6, the pins 2, and the ring 9 operate in the following manner.

(1) First, the motor 18 is driven to lower the prop 6 until the stopper 8 engages the frame 7. When the stopper 8 engages the frame 7, the shaft 6a stops moving downward. As the prop 6 is lowered further, the shaft 6a remains stationary due to the stopper 8. This causes the pins 2 to protrude beyond the top surface of the circular pedestal 3 through the holes 3a. When the upper ends of the pins 2 are flush with the top surface of the circular pedestal 3, the vertical distance between the annular brim 9b and the stoppers 10 is approximately 1 mm. However, the distance between them is not restricted to 1 mm and may lie in a range from 0.5 to 10 mm.

Figure 2:
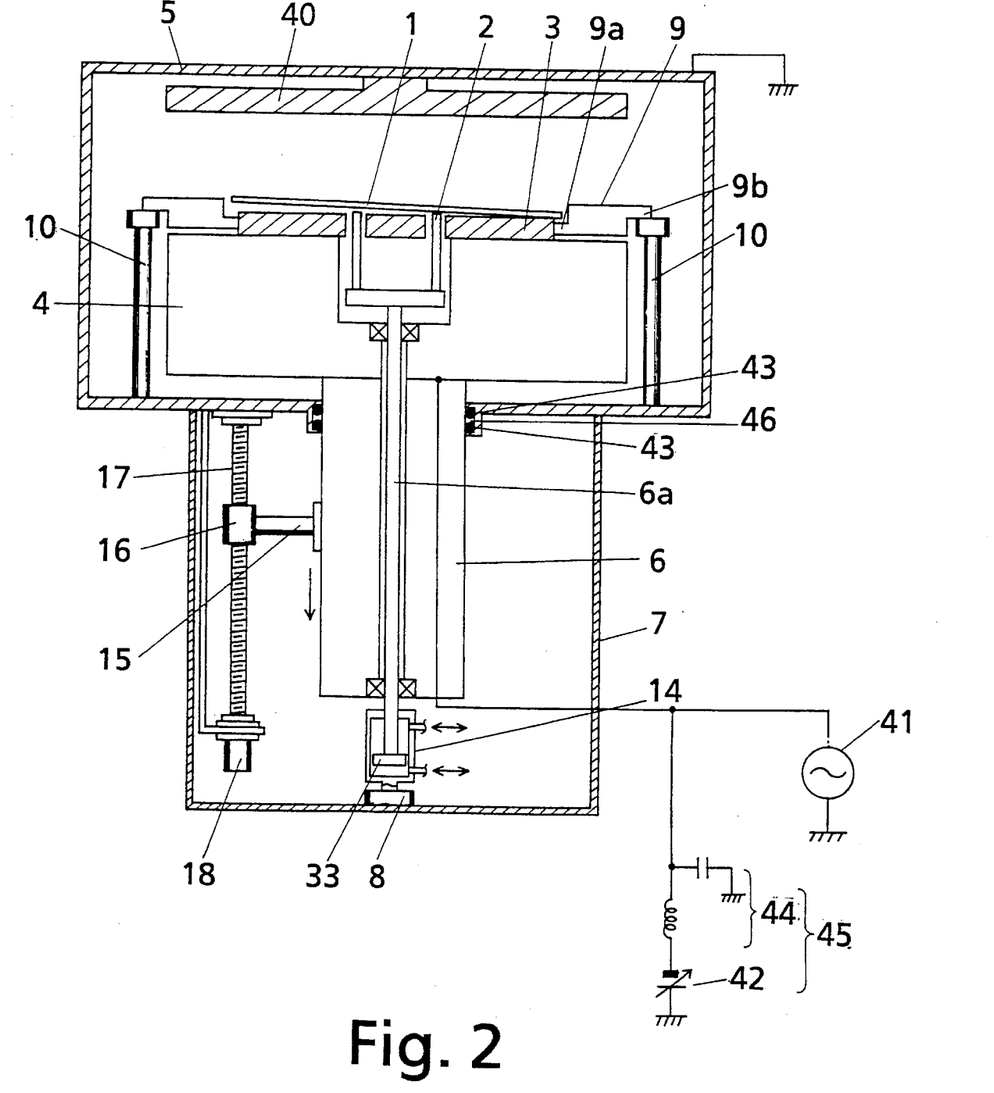
FIG. 2 is a side view partly in section of the mechanism of FIG. 1(a), in which the pins are slightly raised.

(2) When the prop 6 is lowered further, the annular brim 9b comes into contact with the stoppers 10. In this state, the pins 2 protrude about 1 mm beyond the top surface of the circular pedestal 3. A part of the edge of the substrate 1 now adheres to a corner of the circular pedestal 3 due to a residual static charge remaining on the pedestal 3 causing the substrate 1 to tilt as shown in FIG. 2.

Figure 3:
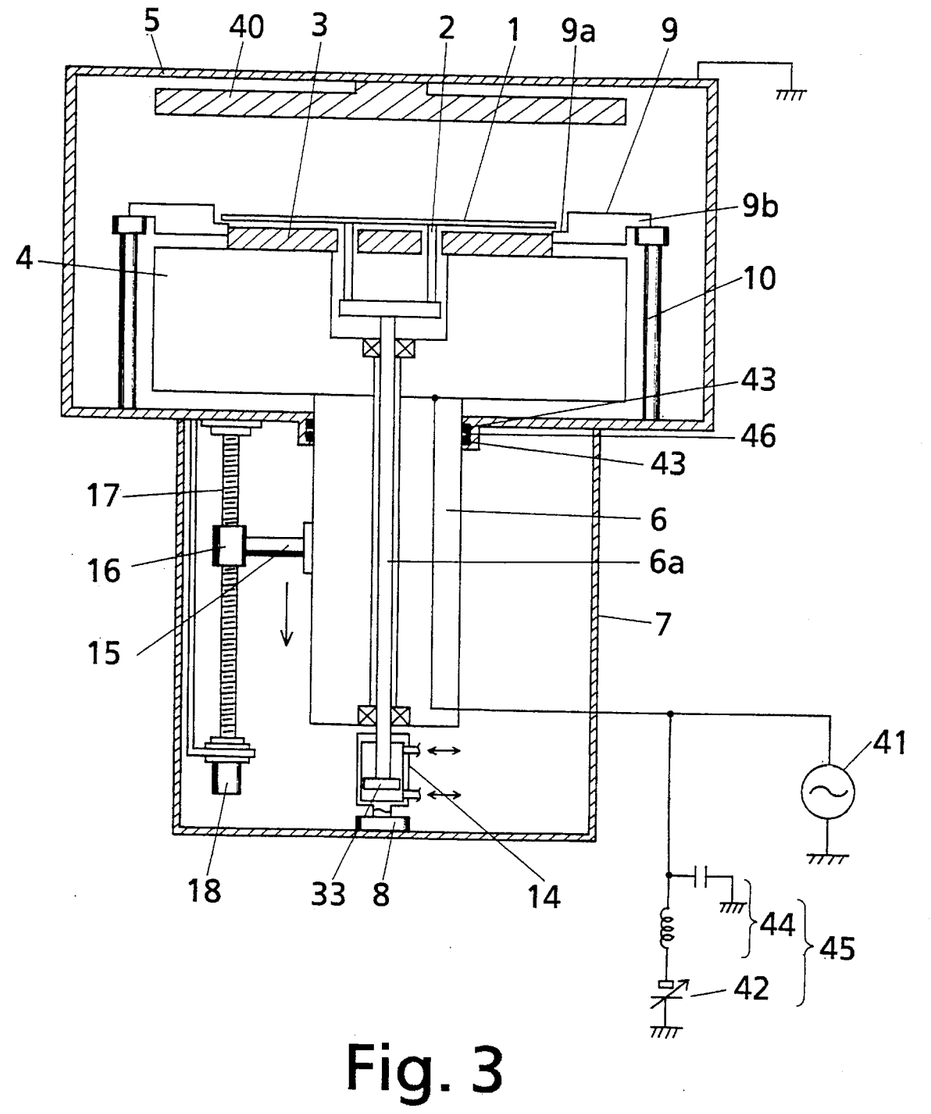
FIG. 3 is a side view partly in section of the mechanism of FIG. 1(a), in which the ring is lifted.

(3) When the prop 6 is lowered further, the pins 2 protrude more than 1 mm. Also, the ring 9 supporting on the stoppers 10 is raised relative to the electrode 4 as shown in FIG. 2. The annular recessed portion 9a of the ring 9 then engages the edge of the substrate 1 which is adhering to the circular pedestal 3. When the ring 9 rises further, the substrate 1 is separated from the corner of the circular pedestal 3 and is raised so that the substrate 1 is positioned above the pedestal 3 on all four of the pins 2. The substrate 1 is completely separated from the circular pedestal 3 as shown in FIG. 3, and the substrate maintains a horizontal position.

Figure 4:
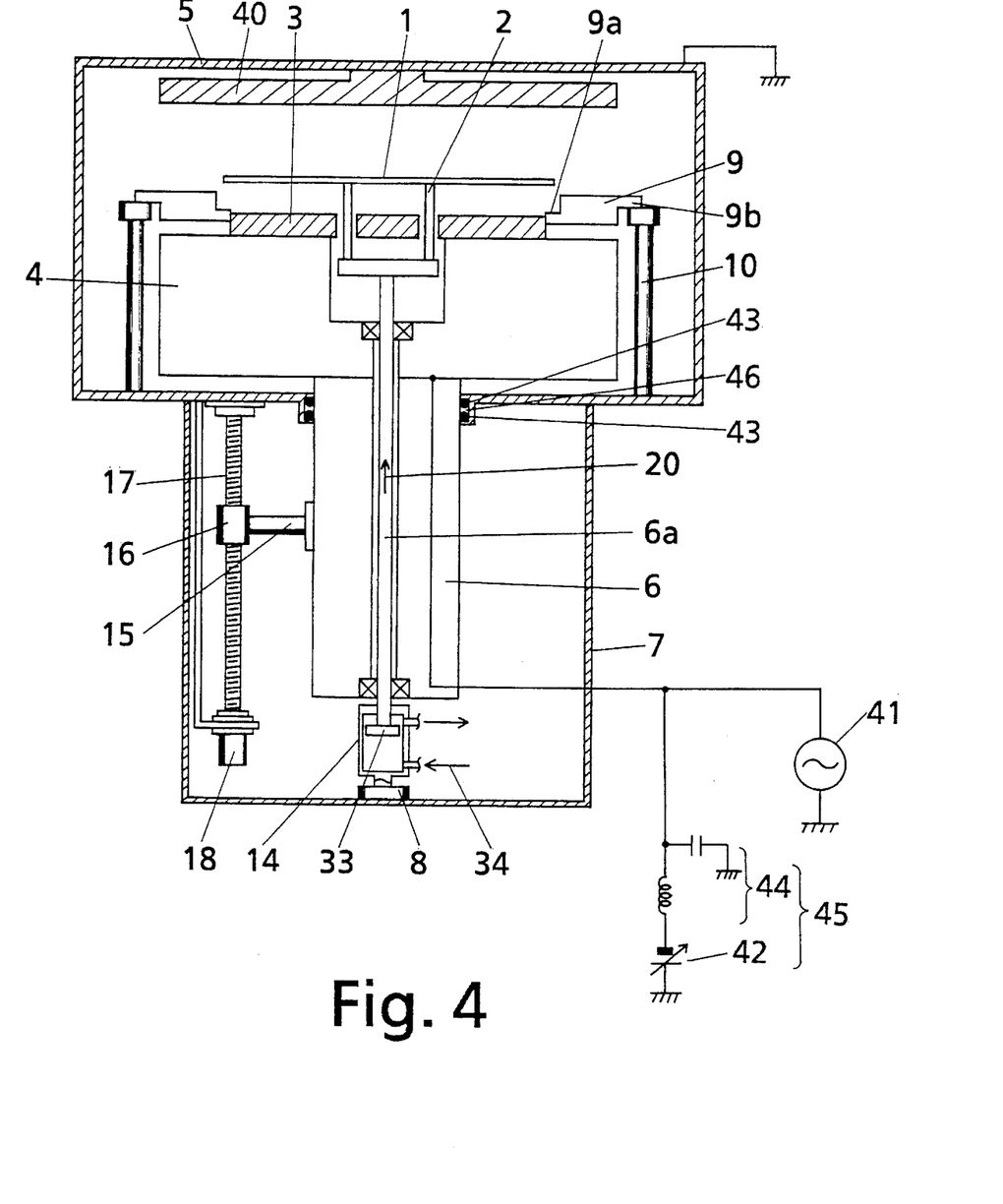
FIG. 4 is a side view partly in section of the mechanism of FIG. 1(a), in which the pins are further raised for transferring a substrate.

(4) Subsequently, as shown in FIG. 4, a pressurized fluid is supplied to the cylinder 14 in the direction indicated by the arrow 34 to raise the shaft 6a in the direction indicated by the arrow 20. When the shaft 6a is moved upward, the pins 2 protrude beyond the floating ring 9. As a result, the substrate 1 is elevated above the ring 9 so that the hand 30 of the transferring robot, shown in FIG. 9, is able to enter between the substrate 1 and the ring 9. The substrate 1 may now be accommodated properly among the four claws 31 of the hand 30 shown in FIG. 9.

Factors other than the residual electric charge may also cause an improper positioning of the substrate. For example, the substrate 1 raised by means of the pins 2 may slip off the pins 2 due to the presence of unexpected vibrations. When the substrate 1 slips off the fixed position on the pedestal 3 due to vibrations and the substrate 1 is then raised, it may be tilted. Even if the substrate is tilted in this way, it can be returned to its original horizontal position by the method described above.

Figure 5:
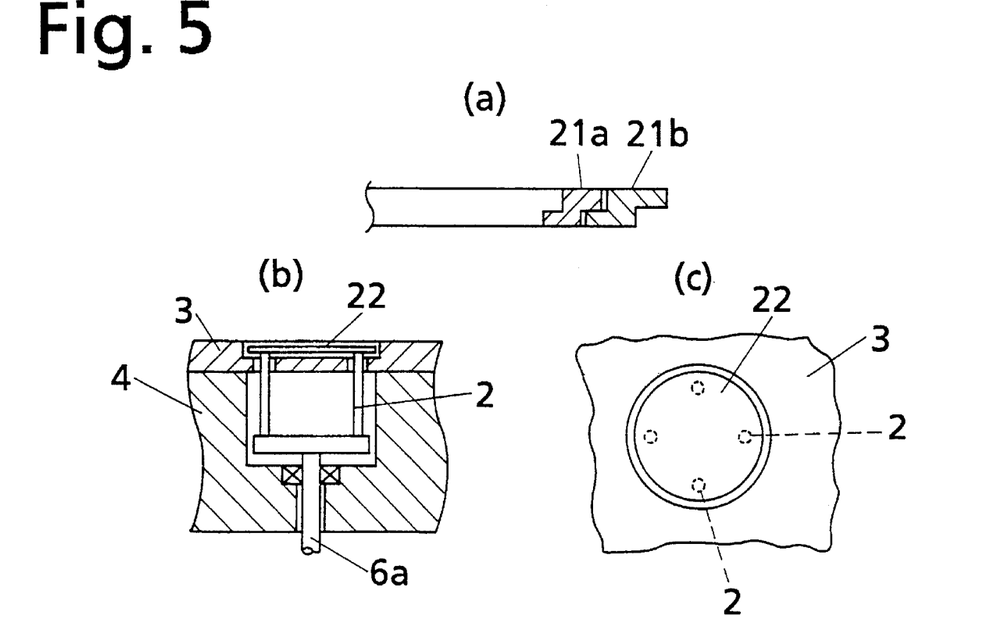
FIG. 5(a) is a fragmentary side-sectional view of a modification of the ring included in the mechanism of in FIG. 1(a)
FIG. 5(b) is a fragmentary side view partly in section of a modification of the pins of the mechanism shown in FIG. 1(a)
FIG. 5(c) is a fragmentary plan view of the modified pins shown in FIG. 5(b)

The ring 9 is preferably made of a metal or a dielectric material. The ring 9 may comprise an inner annular portion 21a and an outer annular portion 21b which are separate members, as shown in FIG. 5(a). This variation provides the advantage that the portion which comes into contact with the substrate 1 can be made of a material different from the material of the portions coming into contact with the stoppers 10. As shown in FIGS. 5(b) and 5(c), a circular plate 22 can be mounted on the tops of the pins 2, in which case the circular plate 22 raises the substrate instead of the pins 2.

It is not necessary for the present invention that the recessed portion 9a take an annular form. At least three protrusions equally spaced from each other may be formed inside the ring 9. The surface of the annular recessed portion 9a which comes into contact with the substrate 1 may be made uneven so that the surface area in contact with the substrate 1 is reduced to a minimum.

Figure 6:
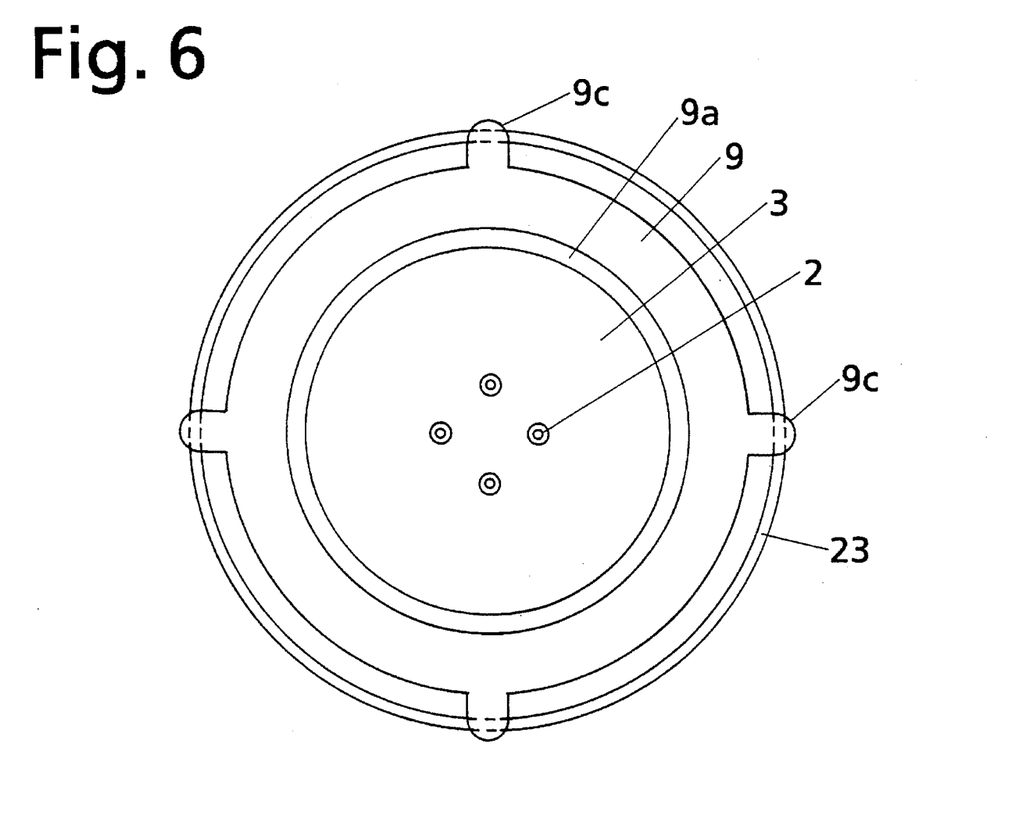
FIG. 6 is a top view of the mechanism of FIGS. 1(a) and 1(b), with a modified ring and modified stoppers.

It is also not essential that the brim 9b be annular. For example, as shown in FIG. 6, at least three (e.g. four) protrusions 9c are formed on the outer surface of the ring 9. In this case, the stoppers 10 are positioned opposite these protrusions. In the above described embodiment, the stoppers 10 stand on the bottom wall of the chamber 5, however, the stoppers 10 may also be formed on a side wall of the chamber 5. In addition, the stoppers 10 may be a cylindrical ring 23 as shown in FIG. 6.

In the embodiment shown in FIGS. 1(a) and 1(b), the electrode 4 is lowered so that the pins 2 and the ring 9 move upward relative to the electrode 4. However, the pins 2 and the ring 9 may be raised while the electrode 4 is held fixed.

Figure 10:
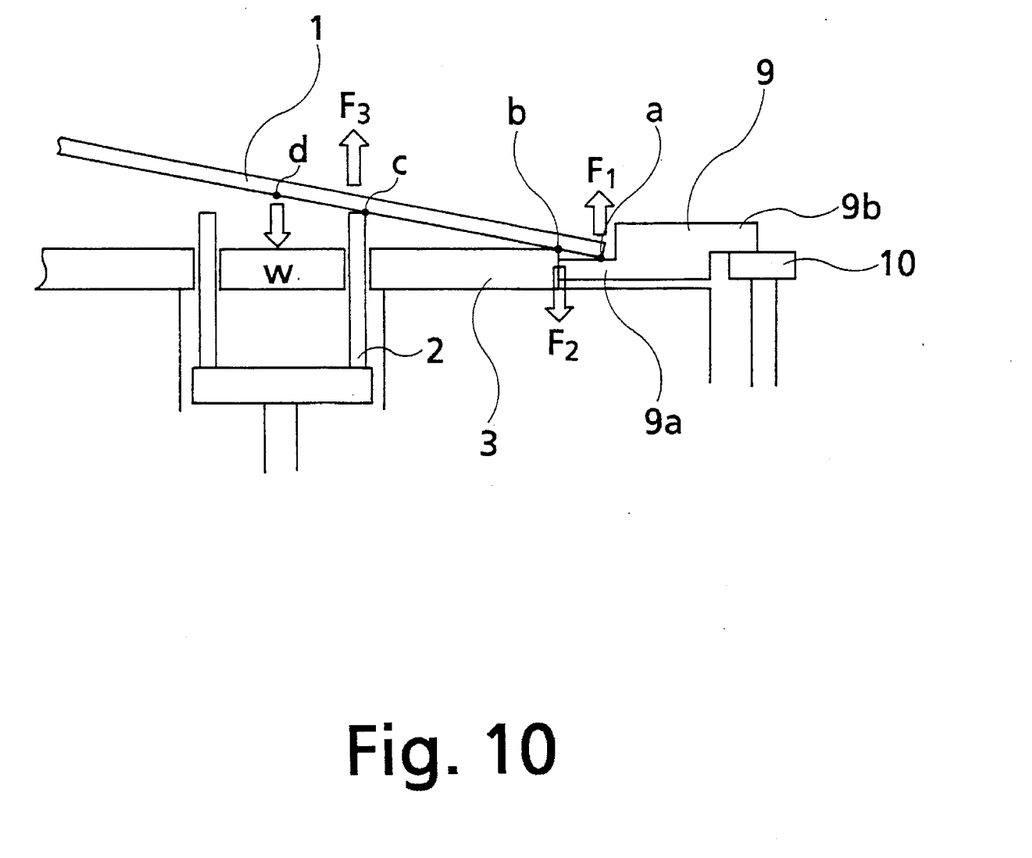
FIG. 10 is an elevation of a mechanical removal mechanism according to the invention, illustrating the forces acting on a substrate.

In the mechanical removal mechanism of the present invention, the force for separating the edge of the substrate 1 clinging to a corner of the pedestal 3 is exerted on the edge of the substrate by the ring 9. FIG. 10 shows the state in which the raised ring 9 is in contact with the edge of the substrate 1 after the substrate 1 has been raised by the pins 2 and tilted due to the residual static charge. In this posture, the forces acting on the substrate 1 as shown in FIG. 10 include force $F_1$ with which the ring 9 raises the edge of the substrate 1 at a point "a" where the substrate is in contact with an annular recessed portion 9a of the ring 9, electrostatic force $F_2$ induced by a residual static charge remaining on the pedestal 3 at a point "b" where the substrate is in contact with a corner of the pedestal 3, force $F_3$ with which the pins 2 raise the substrate 1 at a point "c" where the substrate is in contact with one of the pins 2, and the weight W of the substrate 1 at the center of gravity "d" of the substrate 1. The way in which these forces act on the substrate 1 during the removal of the substrate 1 is described below with reference to FIG. 11 which is a diagram of a portion of a substrate.

Figures 11A, 11B:
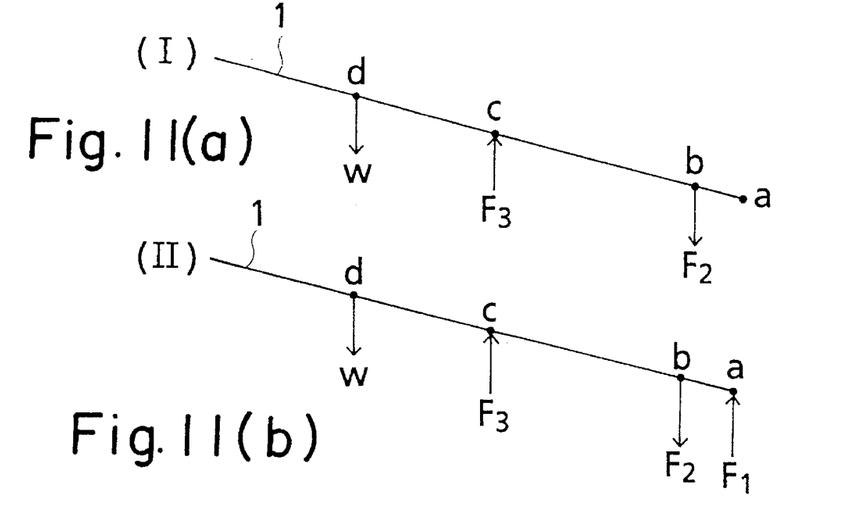
FIG. 11 is a diagram of a portion of a substrate illustrating the forces acting on a substrate as it is separated from a pedestal.
Figure 11C:
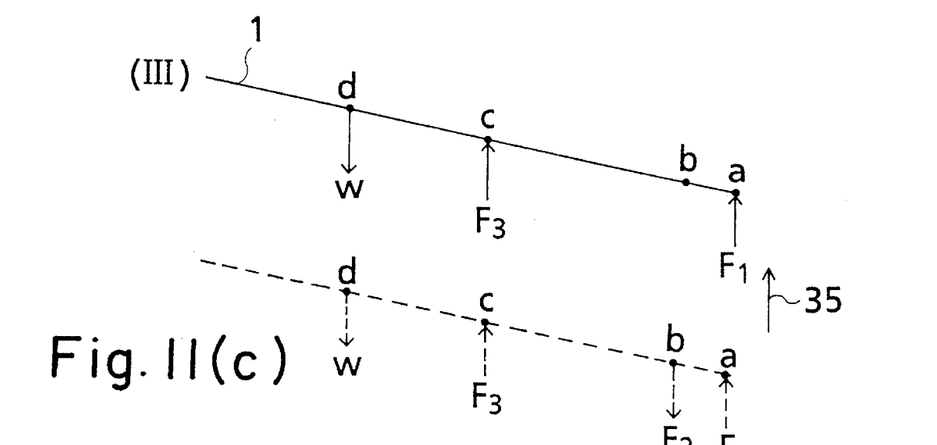
Figure 11D:
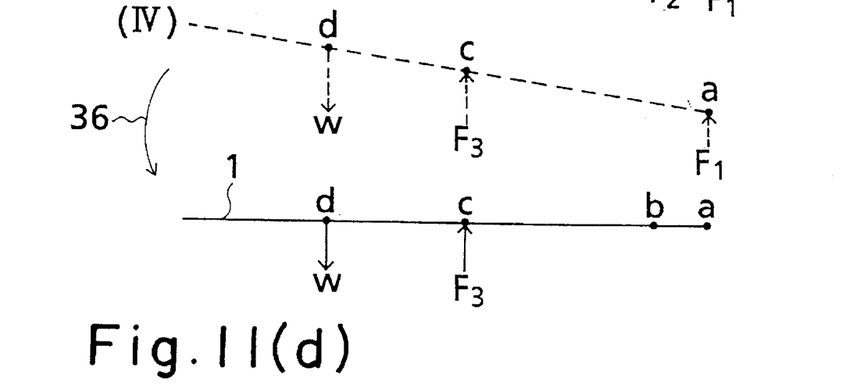

In stage I, the substrate 1 is raised with force $F_3$ at point "c" but is tilted by the action of force $F_2$ at point "b". In this stage, the annular recessed portion 9a of the ring 9 is not yet in contact with the edge of the substrate 1. Therefore, force $F_1$ does not yet act at point "a". It is to be noted that the electrostatic force exerted on the whole substrate due to the residual static charge acts only on point "b", the contact point. Removal of the substrate is accomplished by eliminating the electrostatic force $F_2$ acting at point "b" on the substrate 1.

Figure 12:
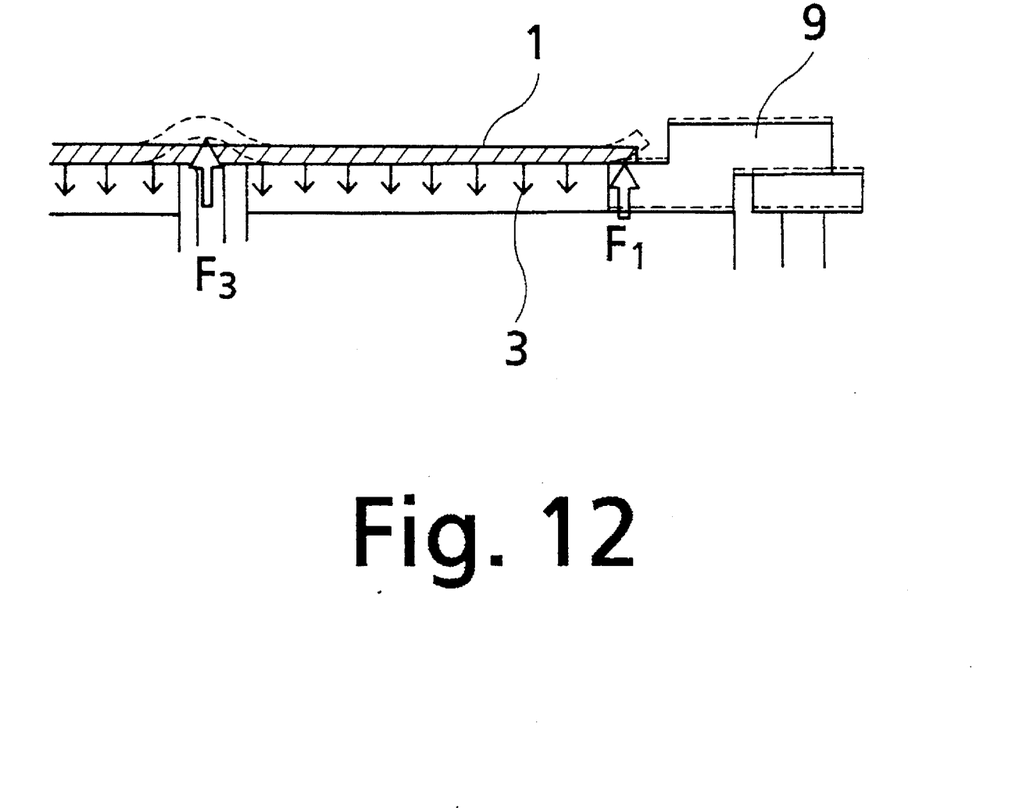
FIG. 12 is a schematic elevation illustrating the forces acting on a substrate when pins and a ring simultaneously raise the substrate.

In stage II, the annular recessed portion 9a is in contact with the edge of the substrate 1, and force $F_1$ acts at point "a". In the present invention, force $F_1$ acts at point "a" after force $F_3$ acts on the substrate 1. In other words, it is important for the mechanical removal of the substrate 1 that the edge of the substrate 1 is raised by the ring 9 after the pins 2 raise the substrate 1, for the following reason. As shown in FIG. 12, in the state in which electrostatic force is exerted uniformly on the whole substrate, if the substrate is lifted by both the pins 2 and the ring 9 simultaneously, the substrate 1 bends in a moment and then springs up. A portion of the bending substrate 1 is adhered to the pedestal 3. As a result, the substrate 1 may accidentally break due to springing-up or bending.

Figure 13:
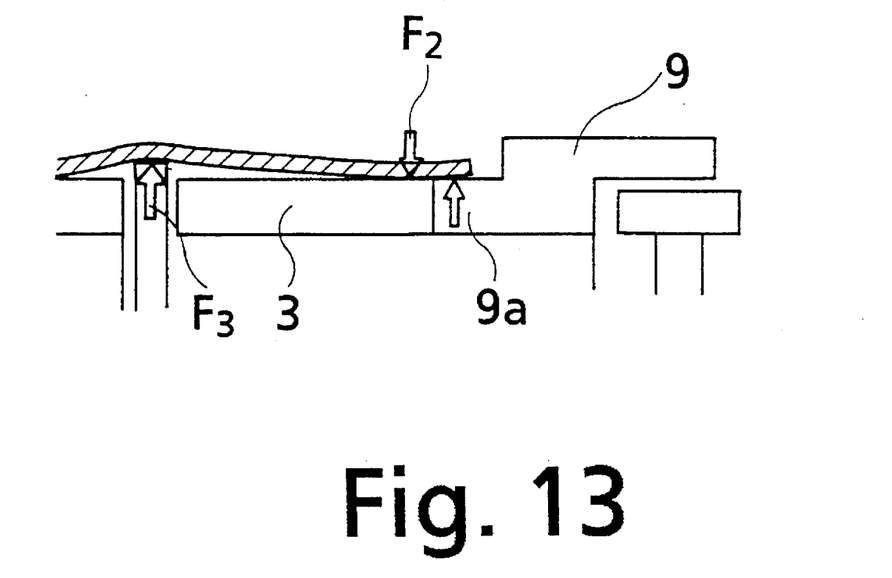
FIG. 13 is a schematic elevation illustrating the forces acting on a substrate when pins raise the substrate where the pedestal and the annular recessed portion of the ring have the same thickness.

In stage I, the annular recessed portion 9a should be thinner than the pedestal 3 so that it will be possible for the substrate to tilt. If the thickness of the annular recessed portion 9a is the same as the thickness of the pedestal 3 as shown in FIG. 13, the substrate 1 will bend and spring up in the same way as described above with respect to FIG. 12, although the edge of the substrate 1 is not lifted by the ring 9. As shown in FIG. 13, the edge of the substrate 1 lies against the annular recessed portion 9a while the pins 2 are used to lift the substrate causing the substrate to bend. Consequently, in order to prevent the substrate 1 from spring up, the annular recessed portion must be positioned lower (i.e. thinner) than the pedestal 3.

In stage III of FIG. 11, the substrate 1 is lifted in the direction indicated by the arrow 35. Forces $F_1$ and $F_3$ are exerted upward on the substrate 1 against the electrostatic force $F_2$ acting downward on the substrate 1 at point "b". While the substrate 1 is being raised, the ring 9 and the pins 2 are preferably raised simultaneously at the same speed by forces $F_1$ and $F_3$, respectively. Therefore, the substrate 1 remains at an angle while it is raised. At the moment the edge of the substrate 1 separates from the corner of the pedestal 3 (point "b") due to the forces $F_1$ and $F_3$, the electrostatic force $F_2$ acting on the substrate is eliminated.

In stage IV of FIG. 11, the tilted substrate 1 is spontaneously moved in the direction indicated by the arrow 36 due to the weight W of the substrate 1 acting at the center of gravity "d" of the substrate 1. As a result, the substrate 1 returns to a horizontal position resting on all of the pins 2. At this time, the edge of the substrate 1 is disengaged from the ring 9 and the force $F_1$ no longer acts on the substrate 1.

In stage III of FIG. 11, the substrate can also be separated from the pedestal 3 and become horizontal through the use of an alternative method. In this alternative method the pins 2 remain stationary and the edge of the substrate 1 is raised only by the ring 9. In this method, point "c" acts as a fulcrum about which the other forces act. The forces $F_1$, and W act counter clockwise about the fulcrum C against the force $F_2$ which acts clockwise. Based on the principle of leverage, the tilted substrate 1 is moved in the direction indicated by the arrow 36 until it is placed on all the pins 2 in a horizontal position.

Figure 7:
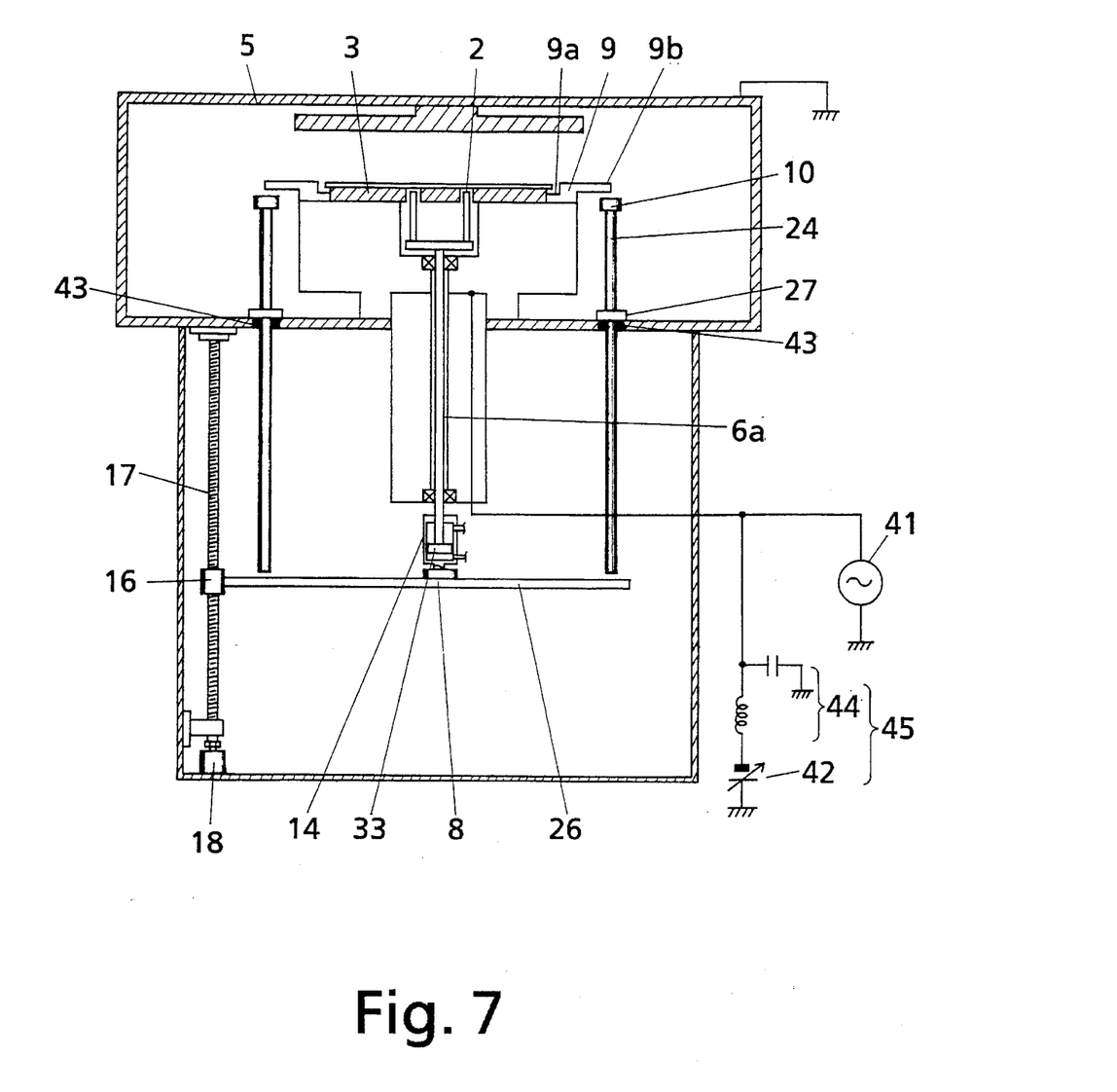
FIG. 7 is a side view partly in section of a mechanical removal mechanism according to a second embodiment of the present invention.

FIG. 7 illustrates a second embodiment of the invention which is similar to the embodiment of FIGS. 1(a) and 1(b) except that the circular pedestal 3 and the electrode 4 are fixed inside the chamber 5 and the pins 2 and the ring 9 can be moved vertically within the electrode.

The embodiment shown in FIG. 7 includes a plate 26 mounted on a nut 16 which is threaded on the screw 17. The plate 26 is mounted under the lower end of the stopper 8 and under the lower ends of vertically movable shafts 24 connected to the stoppers 10. A motor 18 is provided which rotates the screw 17 to move the nut 16, the plate 26 and the stoppers 8, 10.

In operation of the second embodiment, the plate 26 is elevated by operating the motor 18, the plate engages the stopper 8, raising the stopper and shaft 6a. This causes the pins 2 to protrude beyond the top of the circular pedestal 3. During the movement of the plate 26 and the pins 2, the plate 26 engages against the vertically movable shafts 24, thus lifting the stoppers 10. When the pins 2 protrude about 1 mm beyond the circular pedestal 3, the stoppers 10 connected to the shafts 24 engage the annular brim 9b of the ring 9. As the upward movement of the plate 26 is continued, the annular recessed portion 9a of the ring 9 engages the edge of the tilted substrate 1, thus lifting the edge. In this way, the substrate 1 is elevated on all the pins 2 and the ring 9 in a horizontal position. Thereafter, a pressurized fluid is supplied to the lower chamber of the cylinder 14 to lift the pins 2 and raise the substrate 1 above the ring 9 in the same way as in step (4) of the first embodiment. Circular stoppers 27 are mounted on the vertically movable shafts 5, inside the chamber 5. O-rings 43 are also provided to maintain the inside of the chamber 5 airtight.

Figure 14A:
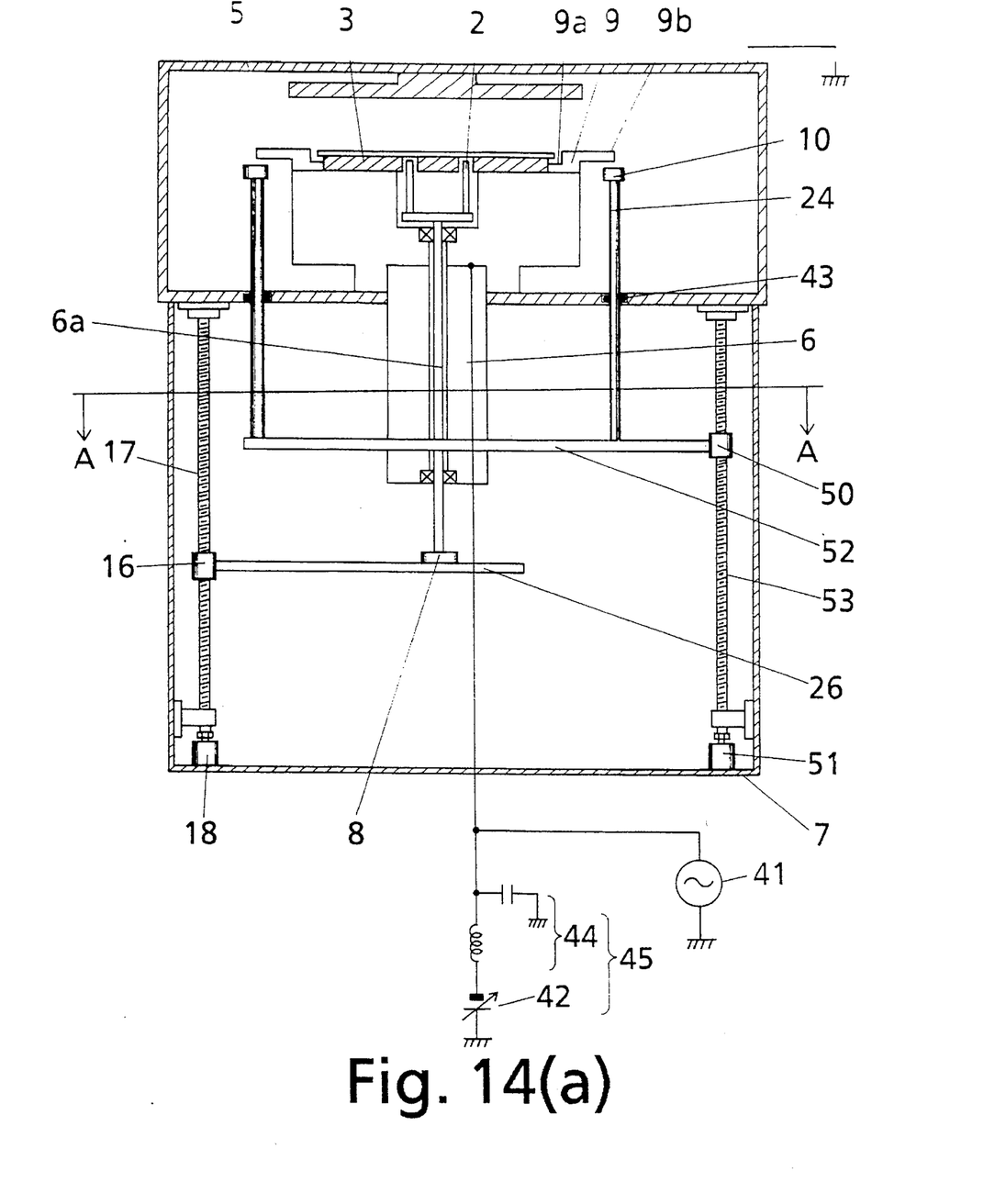
FIG. 14(a) is a side view partly in section of a mechanical removal mechanism according to a third embodiment of the present invention.
Figure 14B:
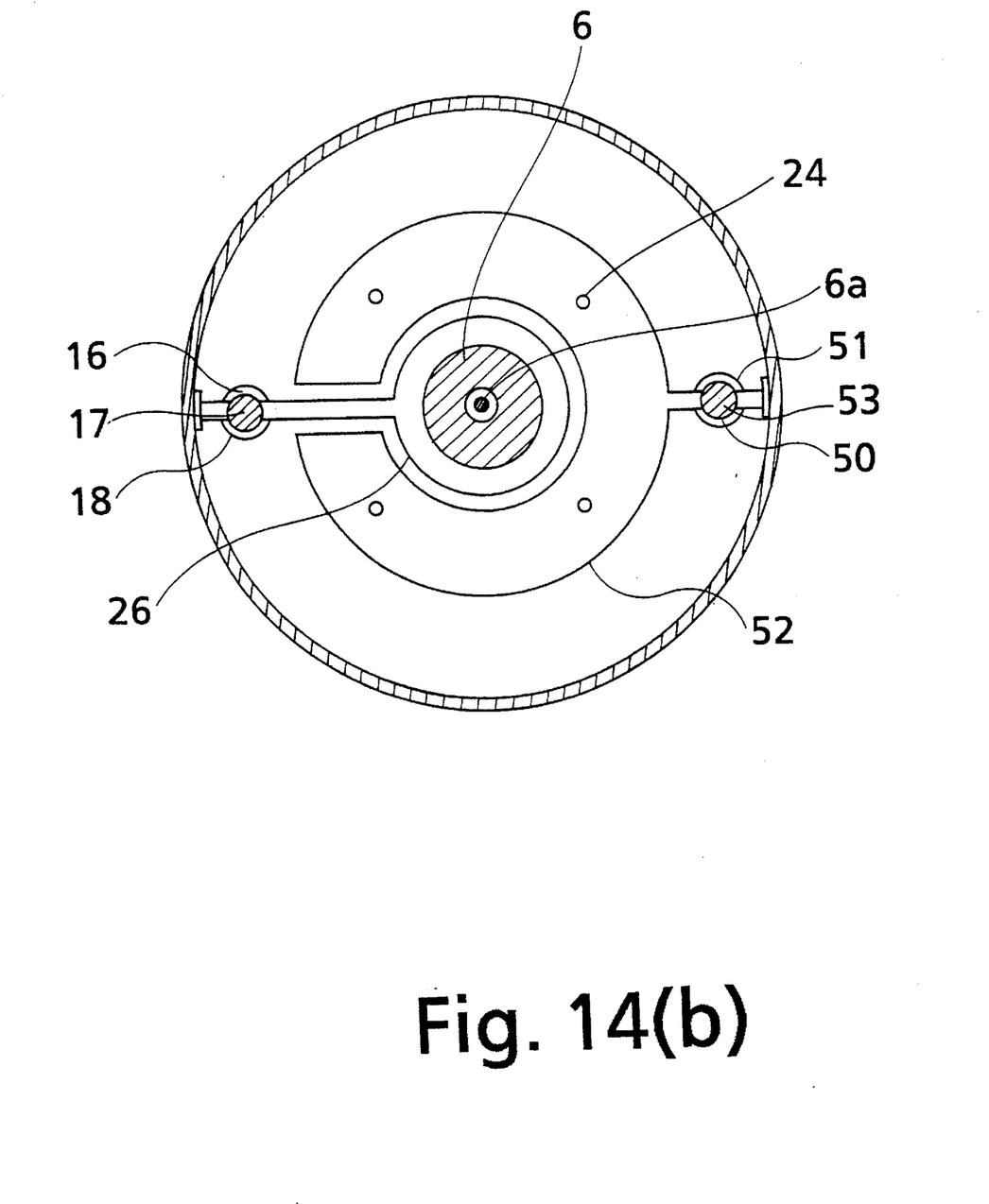
FIG. 14(b) is a sectional view taken along line A—A of FIG. 14(a).

FIG. 14(a) illustrates a third embodiment of the invention which is similar to the first embodiment except that the pins 2 can move vertically independent of the ring 9. To enable this, an independent driving mechanism for raising the ring 9 is added. This driving mechanism comprises the stoppers 10, a horseshoe plate 52, a nut 50, a screw 53, and an electric motor 51. The horseshoe plate 52 is connected to the nut 50 which moves up and down on the screw 53. The shafts 24 are mounted on the horseshoe plate 52. As shown in FIG. 14(b), the circular plate 26 can raise the pins 2 connected to the stopper 8, while the horseshoe plate 52 can raise the ring 9 and the stoppers 10 independent of the movement of the pins 2.

In this third embodiment, the substrate can be removed from the electrode by a method similar to that described above with respect to the first and second embodiments. This method is described in detail below.

(1) The motor 18 is driven to lift the pins 2 until they protrude about 1 mm beyond the top surface of the circular pedestal 3. The substrate 1 is tilted due to a part of the edge of the substrate 1 clinging to a corner of the pedestal 3. Then, the motor 18 is stopped to stop the upward movement of the pins 2.

(2) Subsequently, the motor 51 is driven to lift the ring 9. The annular recessed portion 9a in the raised ring 9 engages the edge of the substrate 1, thus separating the edge of the substrate from the corner of the circular pedestal 3. The recessed portion 9a raises the substrate 1 until the tilted substrate 1 is raised into a horizontal position, whereupon the operation of the motor 51 is stopped. Thus, the upward movement of the ring 9 is stopped.

(3) To take the substrate 1 out of the chamber 5, the motor 18 is again operated to raise the substrate 1 further.

The substrate can also be removed by an alternative method in which, in step (3), the pins 2 are fixed and the substrate 1 is lifted by lifting the ring 9 alone.

In the present invention, the above-described operation for raising the edge of the substrate by means of the ring after the 19 pins lift the substrate can be carried out under many other conditions as long as the substrate can be separated.

The method of holding the substrate on the platform is not limited to a method which makes use of electrostatic clamps. For example, the substrate may be clamped by a vacuum. Furthermore, the invention is applicable to the helicon wave plasma processing chambers described in U.S. Pat. Nos. 4,990,229 and 5,122,251.

As described thus far, in the present invention, a substrate can be completely removed from a base. Additionally, the position of the substrate can be corrected so that the substrate is in a horizontal position before it is transferred which prevents problems from occurring during the transfer operation.

While the invention has been described in detail with reference to specific embodiments thereof, it will be apparent to one skilled in the art that various changes and modifications can be made, and equivalents employed, without departing from the spirit and scope of the invention.

What is claimed is:

1. A mechanism for mechanically removing a substrate, comprising:

a base;

a pedestal placed on said base to hold said substrate, said pedestal having an upper surface which defines a plane and being configured such that when said substrate is placed on said pedestal, an edge of said substrate extends beyond an edge of said pedestal;

at least one substrate elevating member movable in an axial direction to protrude beyond said pedestal and engage said substrate;

a movable ring disposed around said pedestal, said ring having a portion disposed below said edge of said substrate, said portion of said ring defined by having an upper surface which is below the plane defined by the upper surface of said pedestal; and driving means for lifting the edge of the substrate away from the pedestal after the substrate elevating member lift said substrate.

2. A mechanical removal mechanism as set forth in claim 1, wherein said driving means moves said base in said axial direction.

3. A mechanical removal mechanism as set forth in claim 2, wherein said driving means comprises a nut connected to a prop that holds said base, a screw coupled to said nut, an electric motor for rotating said screw, a first stopper for raising said pins by engaging a frame, and second stoppers rigidly mounted around said base to raise said ring.

4. A mechanical removal mechanism as set forth in claim 1, wherein said driving means moves said ring in said axial direction together with said at least one substrate elevating member.

5. A mechanical removal mechanism as set forth in claim 4, wherein said driving means comprises first stoppers for raising said at least one substrate elevating member, second stoppers for raising said ring, a plate for raising said first and second stoppers, and an electric motor for raising said plate.

6. A mechanical removal mechanism as set forth in claim 1, wherein said base is an electrode.

7. A mechanical removal mechanism as set forth in claim 1, wherein said pedestal is made of a dielectric material.

8. A mechanical removal mechanism as set forth in claim 1, wherein said pedestal is made of metal and coated with a thin dielectric film.

9. A mechanical removal mechanism as set forth in claim 1, wherein said at least one substrate elevating member is placed inside said base in positions where said at least one substrate elevating member can lift a central portion of said substrate upward.

10. A mechanism for mechanically removing a substrate, comprising:
   a base;
   a pedestal placed on said base to hold said substrate, said pedestal having an upper surface which defines a plane and being configured such that when said substrate is placed on said pedestal, and edge of said substrate extends beyond an edge of said pedestal;
   substrate elevating members movable in an axial direction to protrude beyond said pedestal;
   a movable ring disposed around said pedestal, said ring having a portion disposed below said edge of said substrate, said portion of said ring having an upper surface which is below the plane defined by the upper surface of said pedestal;
   a first driving means for lifting said substrate elevating members along said axial direction; and
   a second driving means for lifting said ring.

11. A mechanical removal mechanism as set forth in claim 10, wherein said first driving means for raising said substrate elevating members comprises a stopper for raising said substrate elevating members, a circular plate for raising said stopper, a nut connected to said plate, a screw coupled to said nut, and an electric motor for rotating said screw.

12. A mechanical removal mechanism as set forth in claim 10, wherein said second driving means for raising said ring comprises stoppers for raising said ring, a horseshoe plate for raising said stoppers, a nut connected to said plate, a screw coupled to said nut, and an electric motor for rotating said screw.

13. A mechanical removal mechanism as set forth in claim 10, wherein said base is an electrode.

14. A mechanical removal mechanism as set forth in claim 10, wherein said pedestal is made of a dielectric material.

15. A mechanical removal mechanism as set forth in claim 10, wherein said pedestal is made of metal coated with a thin dielectric film.

16. A mechanical removal mechanism as set forth in claim 10, wherein said substrate elevating members are placed inside said base in positions where said substrate elevating members can lift a central portion of said substrate upward.

17. A method of mechanically removing a substrate held on a pedestal comprising the steps of:
   lifting a central portion of said substrate by means of substrate elevating members to separate the central portion of said substrate from the pedestal; and
   lifting an edge of said substrate by means of a ring while raising said substrate by means of said substrate elevating members to remove said substrate from said pedestal.

18. A mechanical removal method as set forth in claim 17, wherein said substrate is lifted about 1 mm by means of said substrate elevating members.

19. A method of mechanically removing a substrate held on a pedestal comprising the steps of:
   lifting a central portion said substrate by means of pins to tilt said substrate with respect to said pedestal; and
   lifting an edge of said substrate by a ring while maintaining said pins stationary.

20. A mechanical removal method as set forth in claim 19, wherein said substrate is lifted about 1 mm by means of said pins.

* * * * *